United States Patent
McGinnis et al.

(10) Patent No.: US 7,112,983 B2
(45) Date of Patent: Sep. 26, 2006

(54) APPARATUS AND METHOD FOR SINGLE DIE BACKSIDE PROBING OF SEMICONDUCTOR DEVICES

(75) Inventors: Patrick J. McGinnis, Poughkeepsie, NY (US); Darrell L. Miles, Wappingers Falls, NY (US); Richard W. Oldrey, Clintondale, NY (US); John D. Sylvestri, Poughkeepsie, NY (US); Manuel J. Villalobos, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 67 days.

(21) Appl. No.: 10/904,435

(22) Filed: Nov. 10, 2004

(65) Prior Publication Data

US 2006/0097742 A1 May 11, 2006

(51) Int. Cl.
*G01R 31/26* (2006.01)
(52) U.S. Cl. .............. 324/765; 324/755; 324/758
(58) Field of Classification Search .............. None
See application file for complete search history.

(56) References Cited

U.S. PATENT DOCUMENTS

| | | | | |
|---|---|---|---|---|
| 5,453,701 A * | 9/1995 | Jensen et al. | | 324/755 |
| 5,698,474 A | 12/1997 | Hurley | | 437/249 |
| 5,786,236 A | 7/1998 | Thompson et al. | | 438/60 |
| 5,990,562 A | 11/1999 | Vallett | | 257/774 |
| 6,078,057 A | 6/2000 | Vallett | | 257/48 |
| 6,245,587 B1 | 6/2001 | Vallett | | 438/18 |
| 6,249,931 B1 | 6/2001 | Sato | | 324/754 |
| 6,255,124 B1 | 7/2001 | Birdsley | | 438/14 |
| 6,277,218 B1 | 8/2001 | Tai et al. | | 148/516 |
| 6,329,212 B1 | 12/2001 | Dobrovolski | | 438/15 |
| 6,354,859 B1 * | 3/2002 | Barabi et al. | | 439/331 |
| 6,452,209 B1 | 9/2002 | Vallett | | 257/48 |
| 6,686,753 B1 * | 2/2004 | Kitahata | | 324/754 |
| 2003/0107387 A1 | 6/2003 | Williams et al. | | 324/754 |
| 2004/0173704 A1 | 9/2004 | Yu et al. | | 257/48 |

OTHER PUBLICATIONS

M. Mahanpour et al.; "Die and Solder Ball Defect Inspection in Flip Chipped Packaged Devices;" found at http://www.fabtech.org/features/tap/articles/06.433.html, . 9 pages, no month/year.
http://www.hypervisioninc.com/procuz.htm, 2 pages, no month/year.

* cited by examiner

*Primary Examiner*—Minh N. Tang
(74) *Attorney, Agent, or Firm*—Lisa U. Jaklitsch; Cantor Colburn LLP

(57) ABSTRACT

An apparatus for facilitating single die backside probing of semiconductor devices includes a chip holder configured for receiving a single integrated circuit die attached thereto, the chip holder maintained in flexible engagement in an X-Y orientation with respect to a lift plate. A lift ring is coupled to the lift plate, the lift ring configured to facilitate adjustment of the lift plate and the chip holder in a Z-direction.

20 Claims, 8 Drawing Sheets

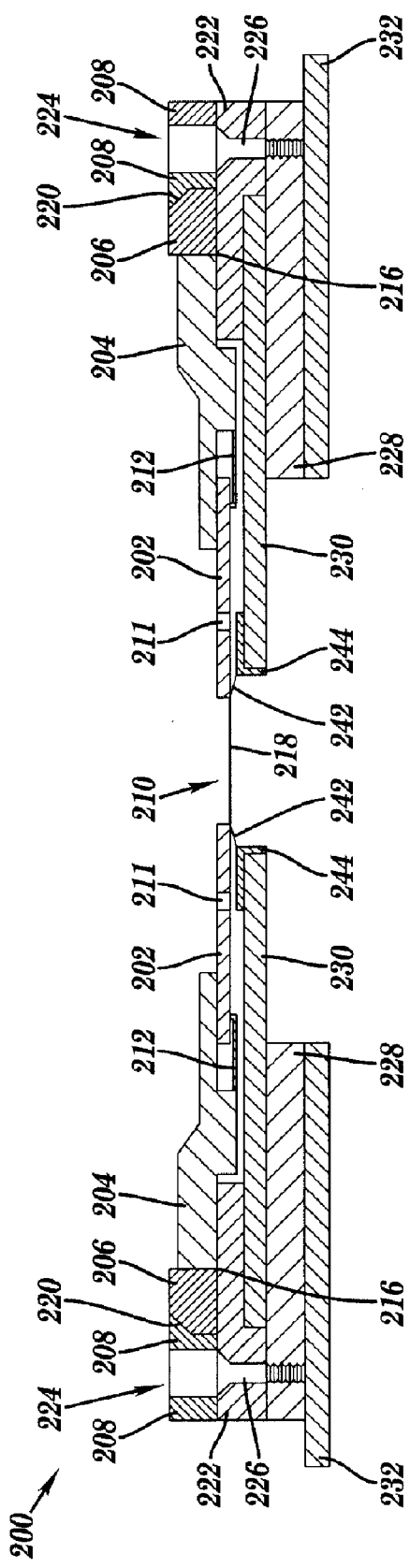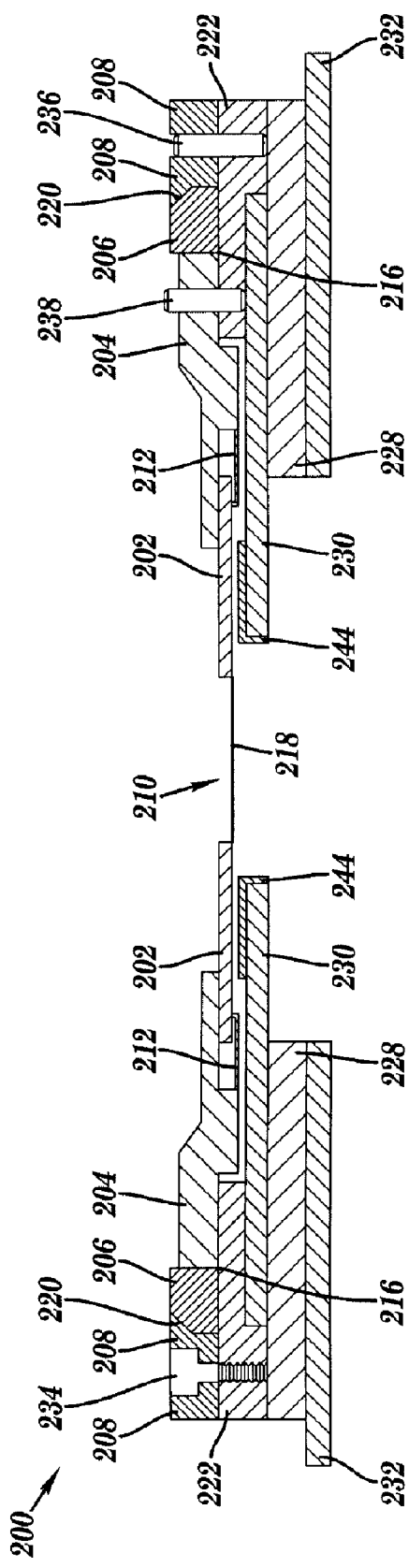

APPARATUS AND METHOD FOR SINGLE DIE BACKSIDE PROBING OF SEMICONDUCTOR DEVICES

BACKGROUND OF INVENTION

The present invention relates generally to semiconductor device manufacturing, and, more particularly, to an apparatus and method for single die backside probing of semiconductor devices.

In the manufacture of semiconductor devices, the ability to obtain waveform measurements from internal nodes has been found to be an indispensable aspect of carrying out failure analysis and characterization. Often, active areas of the semiconductor devices are obscured by I/O (input/output) circuits, interconnect wiring, packaging, or limitations of the probing apparatus. During the integrated circuit development phase, early engineering hardware is typically characterized by subjecting the device to various test conditions such as speed, temperature, and other parameters. Measuring and diagnosing the performance of these devices is implemented by acquiring waveforms from key circuit nodes within the device such as clock signals, enable signals, address buses, and data buses. However, if the early engineering hardware does not perform adequately, or is non-functional, it then becomes important to be able to trace back signals to the source of the problem.

A convenient mode of detecting a failure source is through the use of waveform analysis. The ability to diagnose problems by waveform analysis is also significant during manufacture, as well as throughout the life of the product so that corrective action can be taken. Those skilled in the art will recognize that waveforms may be acquired from internal circuit nodes by direct-contact mechanical probing or electron beam probing. Additional techniques, such as laser-induced light, have also been utilized.

In order to prepare a device for diagnosis, electrical contact is first established with a tester and one or more of the numerous I/O circuits in the device. In some instances, these I/O circuits are placed in the periphery of the device, or located in a manner to provide some degree of access to the device's active areas by some form of mechanical or electron beam probe during operation. However, as a result of increasing circuit complexity, a trend toward higher density packaging, or the density of the I/O circuits and related probes needed to activate the device, improvements in semiconductor device access for mechanical or electron beam probe are needed.

Thus, to facilitate electrical access to the I/O of the IC, additional circuits and pads are frequently positioned adjacent to, or on the uppermost level of the IC die. Quite frequently, such IC dies with I/O circuit elements situated on the top surface have the disadvantage of obstructing internal circuitry. Additionally, packaging methods (often referred to as a "flip-chip", "C4", or direct chip attach (DCA)) may be attached upside-down, or flipped onto a package substrate, or directly onto a circuit board, flexible cable, or other assembly into which the IC is interconnected. As a result, the internal circuit nodes of the IC are buried and inaccessible for characterizing electrical circuit performance, performing diagnostic testing, or performing failure analysis while the IC is operating normally and in a fully functioning state. In particular, with the emergence of technologies such as embedded dynamic random access memory (eDRAM), system on a chip (SOC), and silicon on insulator (SOI) devices, for example, effective backside electrical characterization techniques are desired given the multiple wiring levels of such devices.

Additionally, in the course of performing failure analysis or diagnosing performance problems with semiconductor devices, it is often necessary to apply image based analysis techniques while exercising a chip using a test system. The chip is also referred to as the Device Under Test (DUT). Many of these image based techniques are performed through the backside of the DUT using tools that operate with wavelengths of light that pass through silicon. Backside light emission microscopy is one example of an image based technique. Presently, there are tools commercially available for performing these backside techniques on die mounted in packages or on whole wafers. However, there is currently no available means for performing backside analysis on single bare die.

A drawback in performing such a backside analysis on a packaged die stems from the fact that time and money is spent mounting the die in a suitable package. Furthermore, performing backside analysis on whole wafers is convenient up until such time the wafer is diced. At that point, the die has heretofore been required to be packaged before performing any further analysis thereon.

On the other hand, the probing of bare die presents a more difficult challenge. A conventional probe station retains the die or wafer on a flat disk (chuck), and probes are lowered onto the probe pads from above. Only the top surface of the chip is typically visible. More recently, manufacturers have introduced backside probing probe stations that utilize special probes or probe cards while the wafer is held face down on the station. Special optics are used in order to see the probe pad pattern, as well as the probe needles from the bottom. A small area of the wafer is then thinned, presumably where the defect is located, and the active area thereafter is observed using the same previously mentioned techniques. Thinning the bulk silicon on a single die or in a small region of the wafer is often necessary to improve light transmission in order to be able to observe the circuitry of a die for navigation purposes.

It is not practical to thin an entire wafer, because the resultant thickness of the wafer is insufficient to provide the mechanical rigidity necessary across an entire wafer for backside probing any die on the wafer. Accordingly, only a few select die can be thinned and observed on a given wafer. The remainder of the wafer is maintained at full thickness, thus providing mechanical stability. The selection of which particular die to thin is determined by using previous test results.

Unfortunately, there are several drawbacks associated with conventional backside probing systems. First, such systems are designed to probe an entire wafer. In other words, there is no effective means for probing individual chips. In addition, special probes and/or probe cards are needed to carry out the backside probing. Thirdly, such systems are "combination systems" in that they are built for conventional topside probing and are convertible to backside probing. As such, the switch from one type of probing to the other type typically requires factory trained personnel to reconfigure the tool after switch to a different type of probing operation.

SUMMARY OF INVENTION

The foregoing discussed drawbacks and deficiencies of the prior art are overcome or alleviated by an apparatus for facilitating single die backside probing of semiconductor devices. In an exemplary embodiment, the apparatus includes a chip holder configured for receiving a single integrated circuit die attached thereto, the chip holder maintained in flexible engagement in an X-Y orientation with respect to a lift plate. A lift ring is coupled to the lift plate, the lift ring configured to facilitate adjustment of the lift plate and the chip holder in a Z-direction.

In another embodiment, a system for facilitating single die backside probing of semiconductor devices includes a probing station and a chip holder apparatus configured for mounting in the probing station, the chip holder apparatus further including a chip holder configured for receiving a single integrated circuit die attached thereto. The chip holder is maintained in flexible engagement in an X-Y orientation with respect to a lift plate. A lift ring is coupled to the lift plate, the lift ring configured to facilitate adjustment of the lift plate and the chip holder in a Z-direction.

In still another embodiment, a method for implementing single die backside probing of semiconductor devices includes attaching a single integrated circuit die to a chip holder portion of a chip holding apparatus, and mounting the chip holding apparatus to a probing station in a first orientation. Probe needles of a probe card are aligned to corresponding surfaces on the die, said probe card maintained in flexible engagement with the chip holding apparatus. A Z-axis height adjustment feature of the chip holding apparatus is engaged so as to bring the probe needles into contact with the corresponding surfaces on the die. The chip holding apparatus is removed and remounted to the probing station in a second orientation flipped with respect to the first orientation, wherein said the orientation facilitates connection of test circuitry to the probe card.

BRIEF DESCRIPTION OF DRAWINGS

Referring to the exemplary drawings wherein like elements are numbered alike in the several Figures:

FIG. 3(a) is a cross sectional view of the apparatus of FIG. 2, taken along the reference line "A—A" thereof;

FIG. 3(b) is another cross sectional view of the apparatus of FIG. 2, taken along the reference line "B—B" thereof;

DETAILED DESCRIPTION

Disclosed herein is an apparatus and method for single die backside probing of semiconductor devices that allows for an individual die to be backside-analyzed using presently available cantilever probe cards. The apparatus may also be adapted for use in conjunction with an optical microscope (e.g., such as those available from Hypervision and Hamamatsu companies) built on a standard probe station (e.g., such as available from Karl Suss, Wentworth, Cascade, Micromanipulator and others). Although existing systems are adapted for whole-wafer backside probing equipment, none are presently suited for single die probing, as are the present invention embodiments described hereinafter.

Briefly stated, an embodiment of the apparatus includes a mechanism for receiving a cantilever probe card and a mechanical mount for employing "Z" height adjustment, as well as a plate with a hole in the center thereof to hold the die to be examined. The die to be analyzed is held in an inverted position over a cantilever probe card so that it may be examined using an optical microscope. An advantage stemming therefrom over currently available technology is that backside analysis may be performed on single die without wirebonding the die into a package.

Figure 1:
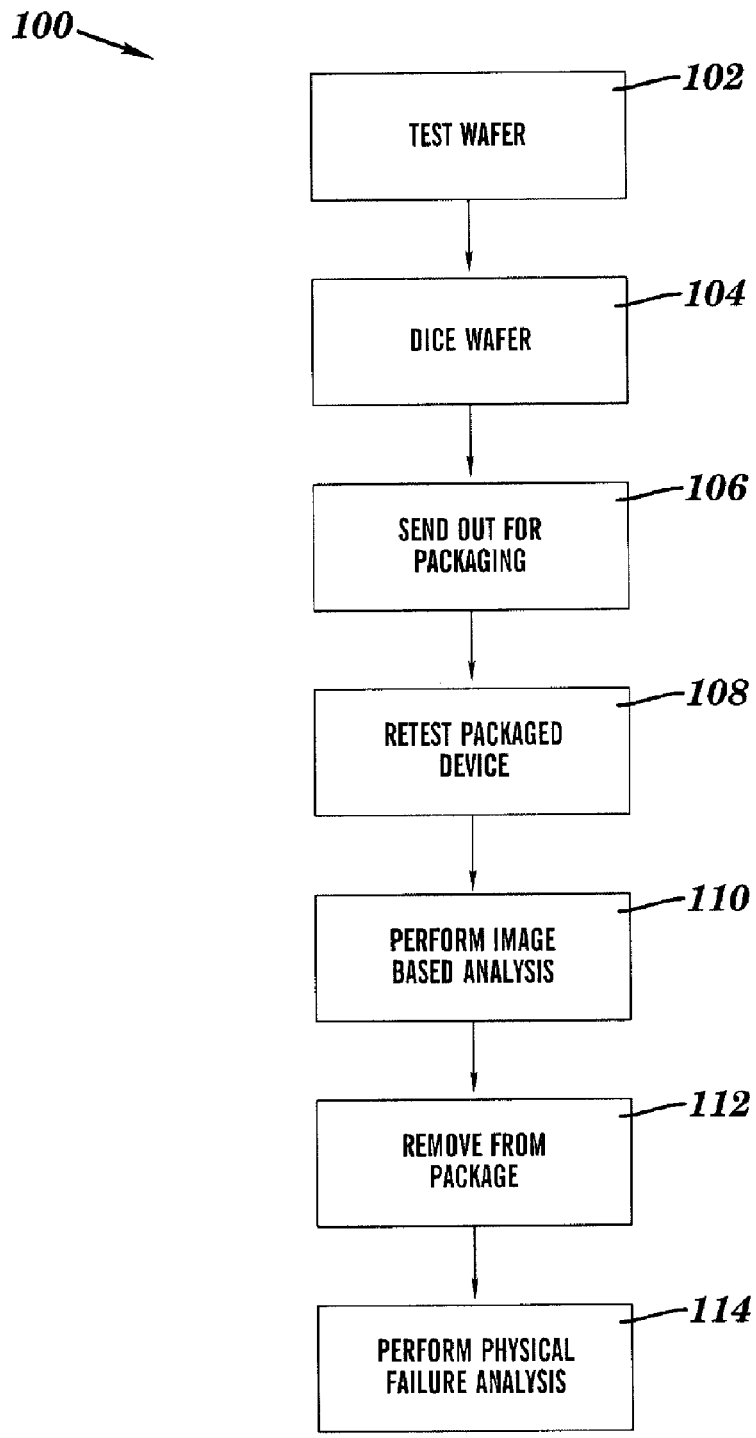
FIG. 1 is a process flow diagram of a conventional method of single die backside probing and analysis.

Referring initially to FIG. 1, there is shown 1 process flow diagram of a conventional method 100 of single die backside probing and analysis. Initially, a wafer is tested as shown in block 102, after which the individual dies on the wafer are separated from one another as shown in block 104. At this point, any individual die that have failed wafer level testing may be further analyzed using package level testing. Thus, at block 106, each individual die is conventionally sent out for individual packaging, since prior to the present invention embodiments there were no effective means for probing unpackaged, individual chips. Unfortunately, this step of sending out individual chips for packaging can take weeks and is a relatively costly process.

Once the packaged die is returned, it may then be retested as shown in block 108. The testing may also include an image-based analysis (e.g., through the use of a probe station) as shown in block 110. If the die is determined to be bad, then it is removed from its packaging as shown in block 112, wherein the costly packaging is typically destroyed in the process. Finally, a physical failure analysis is performed as shown in block 114.

Figure 2:
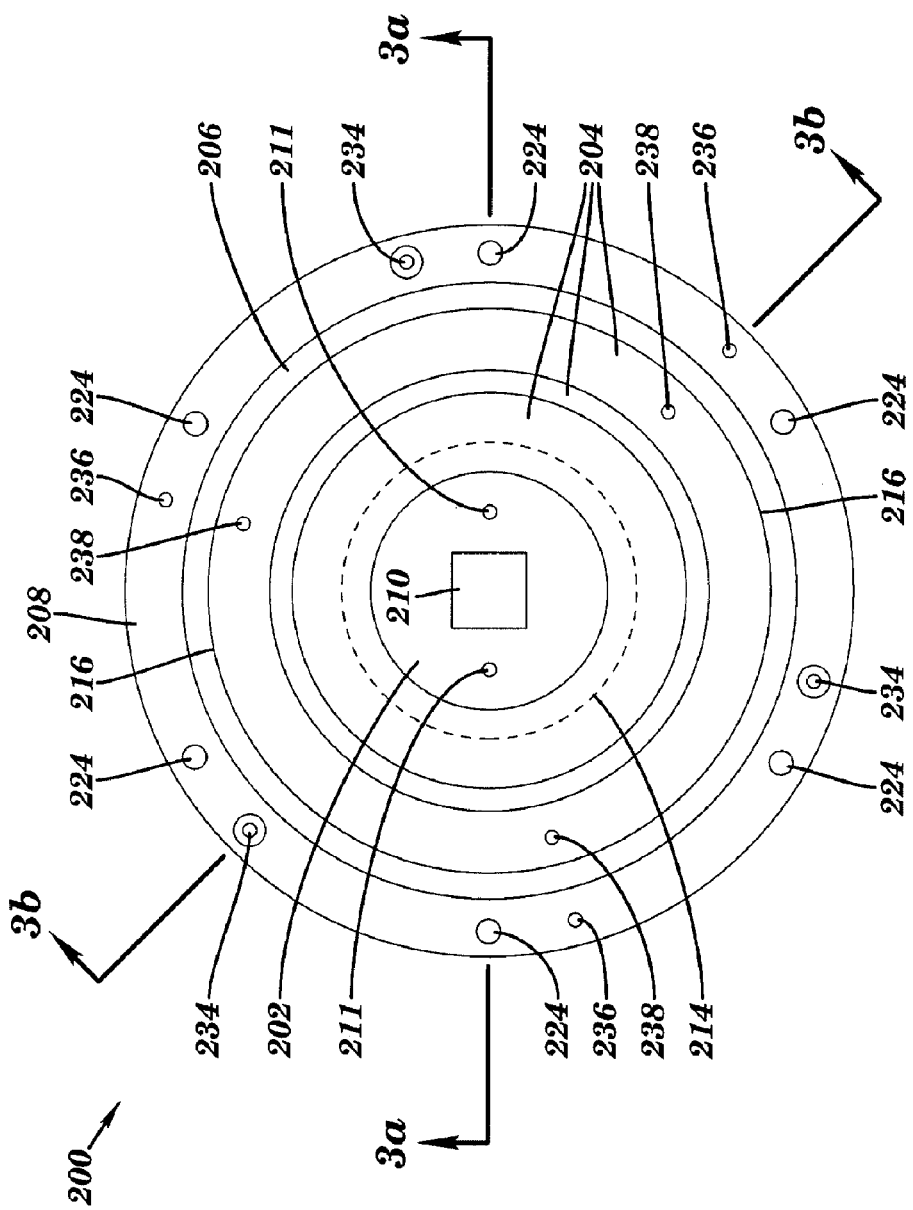
FIG. 2 is a top view of an apparatus for facilitating single die backside probing of semiconductor devices in accordance with an embodiment of the invention.

Accordingly, FIGS. 2-3 illustrate an apparatus 200 for facilitating single die backside probing of semiconductor devices, in accordance with an embodiment of the invention. The apparatus 200 is an assembly that generally includes a chip holder 202, lift plate 204, lift ring 206 and lift ring retainer ring 208 (referred to a retainer ring hereinafter). In an exemplary embodiment, the chip holder 202 is a stepped circular disk formed from a stable material, such as stainless steel, and includes a rectangular opening 210 in the center thereof that is particularly adapted for optical access to a chip during probing. A pair of alignment holes 211 is also formed within the chip holder 202 for receiving corresponding pins of a probe station alignment plate (discussed hereinafter). The chip holder 202 is maintained in flexible contact with the lift plate 204 through one or more spring clips 212 (shown in the cross sectional views of FIGS. 3(a) and 3(b)). The spring clips 212 are preferably sufficiently strong so as to overcome the force necessary to hold probe needles in good contact with the probe pads on the surface of an attached chip. On the other hand, the spring clips 212 should allow for movement in "X" and "Y" directions, as well as in an angular direction.

As the outer edge 214 of the chip holder 202 is disposed beneath the lift plate 204 with respect to the view of FIG. 2, it is shown in phantom therein. The lift plate 204 is coupled to the lift ring 206 by means of fine pitch threads at the interface 216 therebetween. As described in further detail herein, the lift ring 206 may be manipulated so as to provide a Z-axis height adjustment of the lift plate 204 and chip 218 (FIGS. 3(a), 3(b)) attached thereto. The retainer ring 208 includes a beveled edge 220 for retaining the lift ring 206, lift plate 204 and chip holder on a main mounting surface 222.

As particularly shown in the plan view of FIG. 2 and the cross sectional view of FIG. 3(a), a plurality of clearance holes 224 are provided around the circumference of the retainer ring 208 in order to accommodate screws 226 for securing the main mounting surface 222 to a double ended pogo tower 228. The pogo tower 228 includes pins (not shown) that provide both a mechanical and an electrical interface between a cantilever probe card 230 and a printed circuit board 232 (FIGS. 3(a), 3(b)). The circuit board 232 is configured to provide a connection to a test system (discussed later) through cabling (not shown).

In addition to the clearance holes 224, the retainer ring 208 further accommodates a plurality of counter bore holes for securing the retainer ring 208 to the main mounting surface 222 by means of socket head cap screws 234. Alignment of the retainer ring 208 to the main mounting surface 222 may be accomplished through the use of dowel pins 236. The socket head cap screws 234 and dowel pins 236 are illustrated in FIG. 2 and in the cross sectional view of FIG. 3(b). Similarly, dowel pins 238 are also used for aligning the lift plate 204 with the main mounting surface 222, as best shown in FIG. 3(b).

FIGS. 3(a) and 3(b) additionally illustrate the attachment of the chip (die) 218 to the chip holder 202, such that the area of interest on the chip 218 is positioned over the rectangular opening 210. It will be appreciated that the dimensions of the opening 210 in the chip holder 202 may be customized to the particular shape and size of the die to be probed. Thus, several chip holders having openings of various sizes may be constructed. The chip 218 may be attached by its edges to the perimeter of the opening 210 by a suitable adhesive, such as cyanoacrylate (crazy glue) for example.

Before engaging the needles of probe card 230 with the corresponding probe pads of the chip 218, an X-Y alignment of the chip 218 with respect to the probe card 230 is performed. Then, the Z-axis height adjustment feature of the apparatus 200 (provided by the cooperation of lift ring 206 and lift plate 204) is used to bring the probe needles 242 in contact with the probe pads on the chip 218. The probe needles 242 are particularly shown in FIG. 3(a), and are affixed to the main portion of the probe card 230 through a suitable adhesive material 244, such as epoxy, for example.

Figure 4:
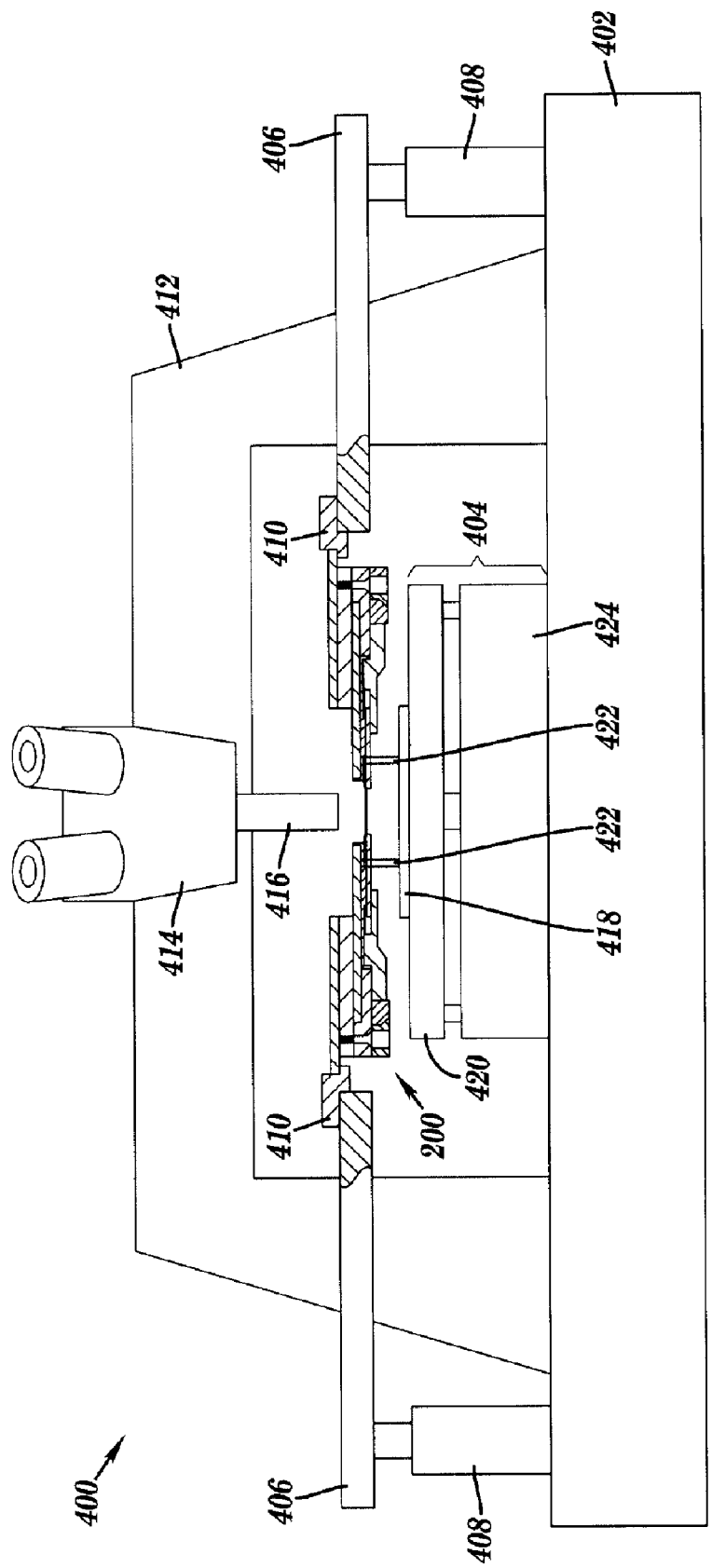
FIG. 4 is a schematic diagram of the apparatus of FIGS. 2 and 3, utilized in conjunction with a probing station, in which the apparatus is disposed in an initial alignment configuration.

Referring now to FIG. 4, there is shown a schematic diagram of the apparatus 200 of FIGS. 2 and 3, utilized in conjunction with a probing station 400. As is shown, the apparatus 200 is disposed in an initial alignment configuration wherein the orientation of the apparatus 200 is "upside down" for alignment purposes. The probing station 400 features a station base member 402 on which a chuck assembly 404 is mounted. The base member 402 also supports a platen 406 mounted on pistons 408 that facilitate a general Z-axis adjustment of the entire apparatus 200. Apparatus 200 rests on mounting hardware 410 attached to the platen 406. In order to provide image based/optical analysis capability, the probing station 400 further includes a microscope bridge 412 for supporting an optical microscope 414, wherein at least one lens 416 thereof is positioned for viewing the chip attached to the apparatus 200.

Figure 5:
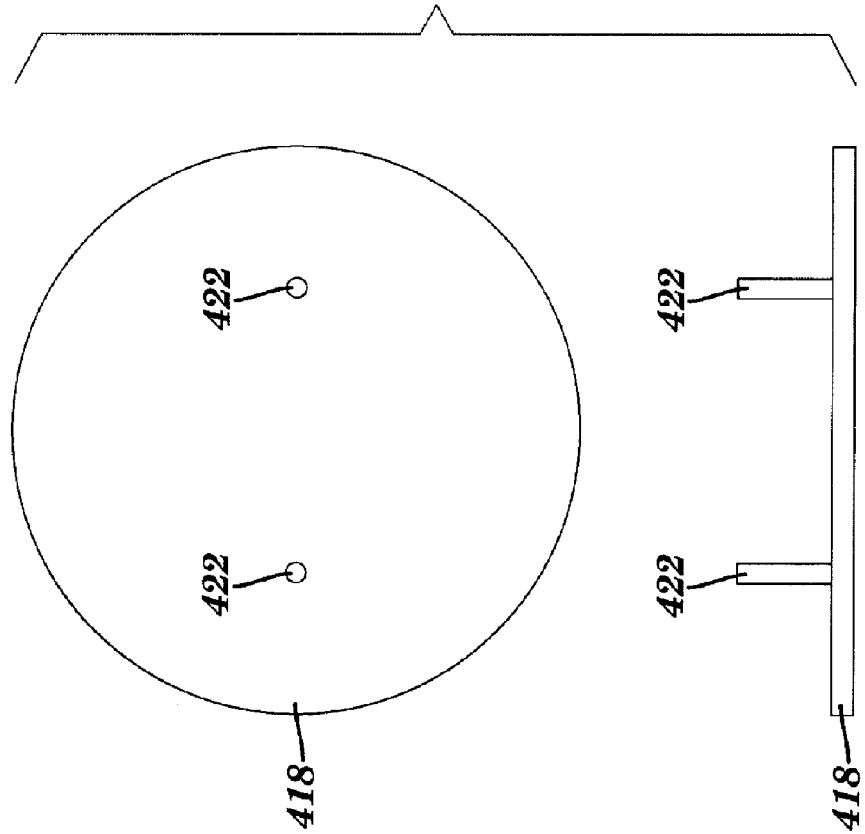
FIG. 5 is a top and side view of an alignment plate used in connection with the probing station of FIG. 4.

As stated previously, the apparatus 200 is placed in an upside down position for initial alignment prior to contacting the probe card needles to the probe pads on the chip probe pads. In this regard, the chuck assembly 404 has an alignment plate 418 vacuum-secured to the top surface of the chuck 420, such that pins 422 on the alignment plate 418 will engage the corresponding holes 211 of the chip holder 202 (FIGS. 2, 3(a)). The alignment plate 418 is shown in further detail in FIG. 5. The height of the chuck 420, as well as the X-Y position are adjustable through a positioning mechanism 424 of the chuck assembly 404. It will be noted that the probe station 400 is not depicted to scale, and that a certain amount of clearance between the top of the chuck 400 and the apparatus 200 will be provided for access to the lift ring 206 to facilitate Z-axis adjustment of the lift plate 204.

Accordingly, through the use of probe station 400, the alignment of the probe needles with the probe pads is performed using the fine motion of the chuck assembly 404. The chip holder 202 (with the chip 218) mounted thereto is held in place by the spring clips 212 that allow for "X" and "Y" motion. The "Z" height of the lift plate 204 is initially set to allow clearance between the needles 242 of the probe card 230 and the pads of the chip 218 during this "X" and "Y" adjustment, which is again facilitated through the holes 211 in the chip holder 202, in combination with the alignment plate 418 on the chuck assembly 404. Following completion of the X-Y alignment, the "Z" height of the lift plate 204 is manually adjusted to bring the needles into contact with the pads. Manual adjustment of the lift plate may be accomplished by engaging a tool, such as a spanner wrench, with a hole(s) formed in the surface of the lift ring 206.

Figure 6:
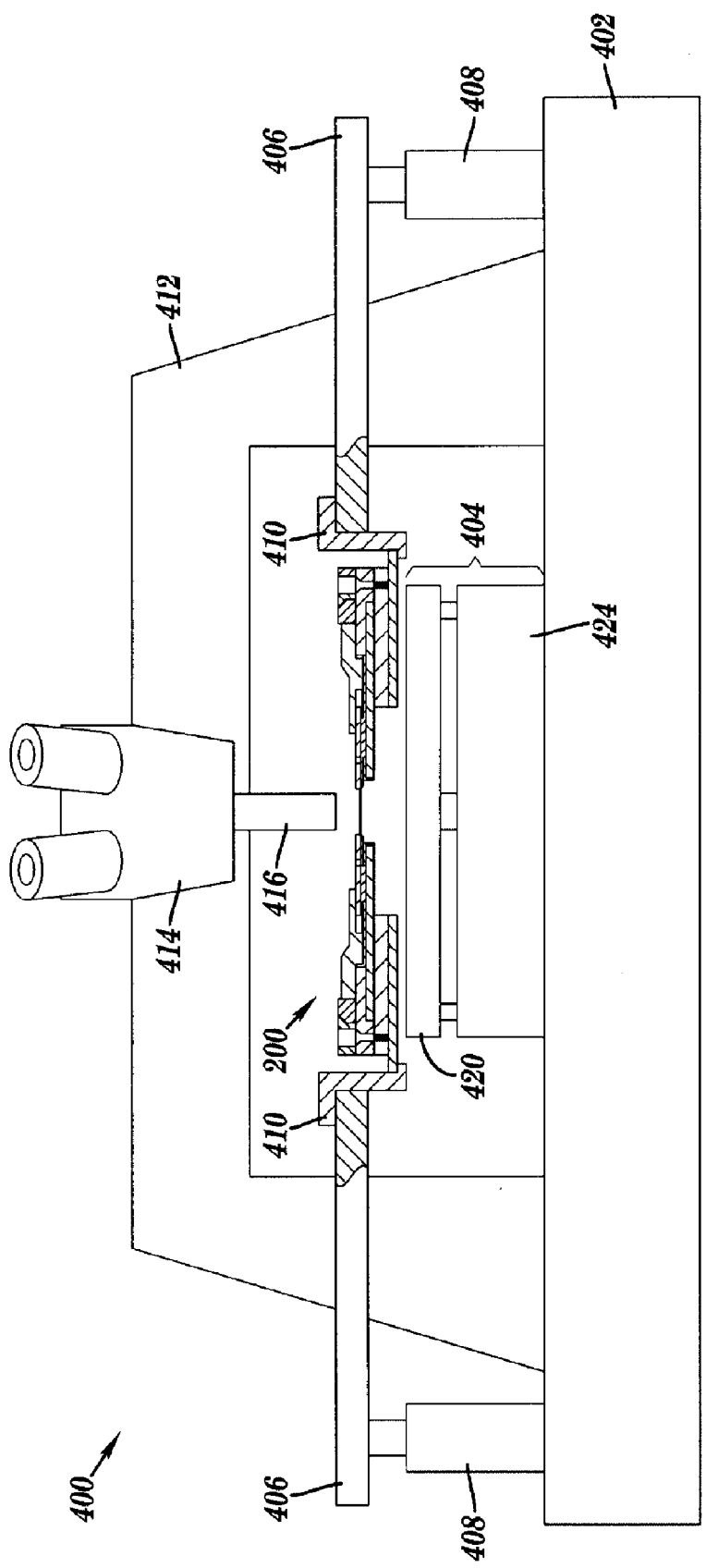
FIG. 6 is a schematic diagram of the probing station and apparatus of FIG. 4, in which the apparatus is disposed in an analysis configuration.

Referring now to FIG. 6, the probe station 400 and apparatus 200 are shown together in an analysis configuration following the initial alignment configuration. At this point, the apparatus 200 has been disengaged from the pins 422 of the alignment plate 418 by lowering the height of the chuck 420. The alignment pin plate 418 is then removed from the chuck 420 and the assembly 200 is flipped upside down (with respect to its orientation in FIG. 4) to be plugged into a tester interface of the probe station 400. In this manner, the backside of the chip 218 is now exposed and readied for examination such as by backside light emission or any other available diagnostic technique that can be carried out with the probe station 400.

Figure 7:
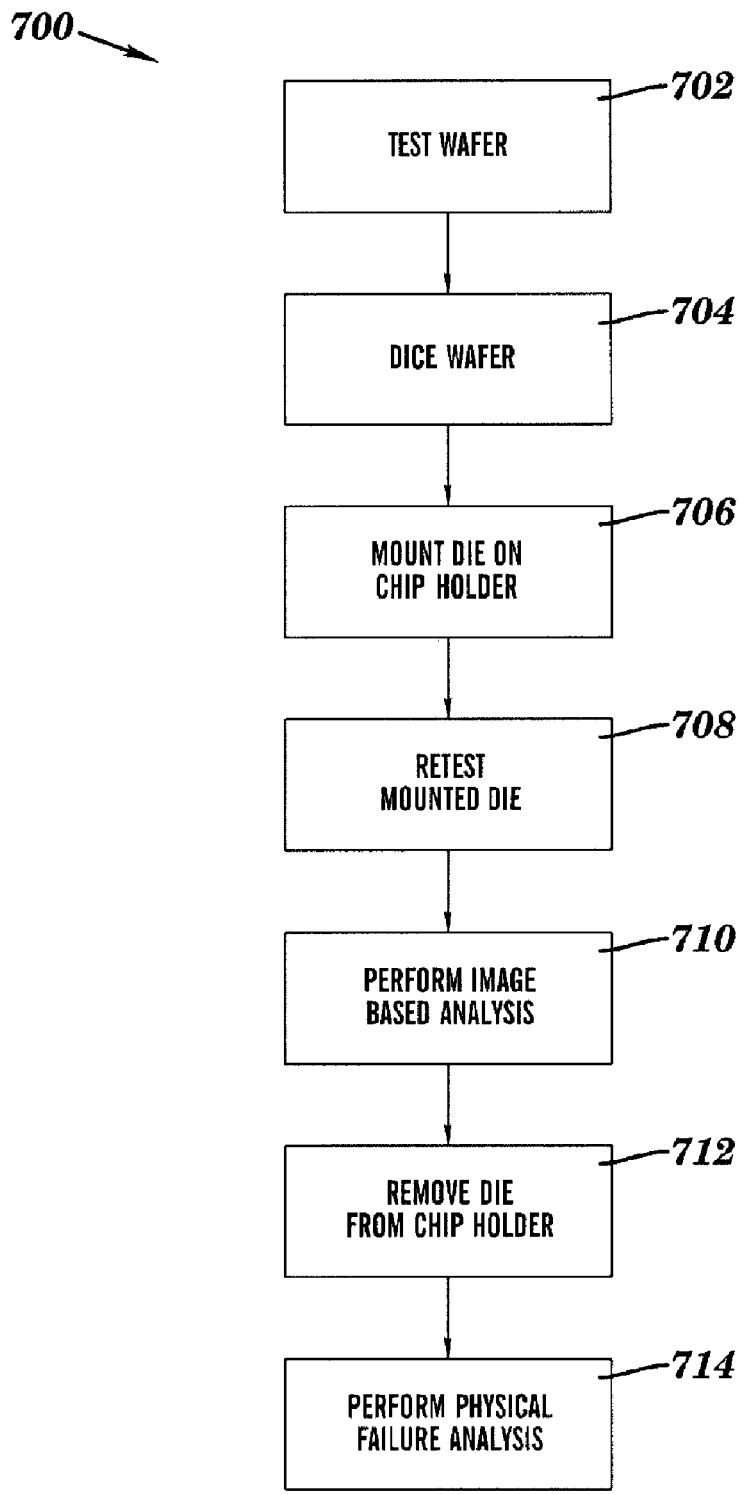
FIG. 7 is a process flow diagram of a method of single die backside probing and analysis, in accordance with an embodiment of the invention.
Figure 8:
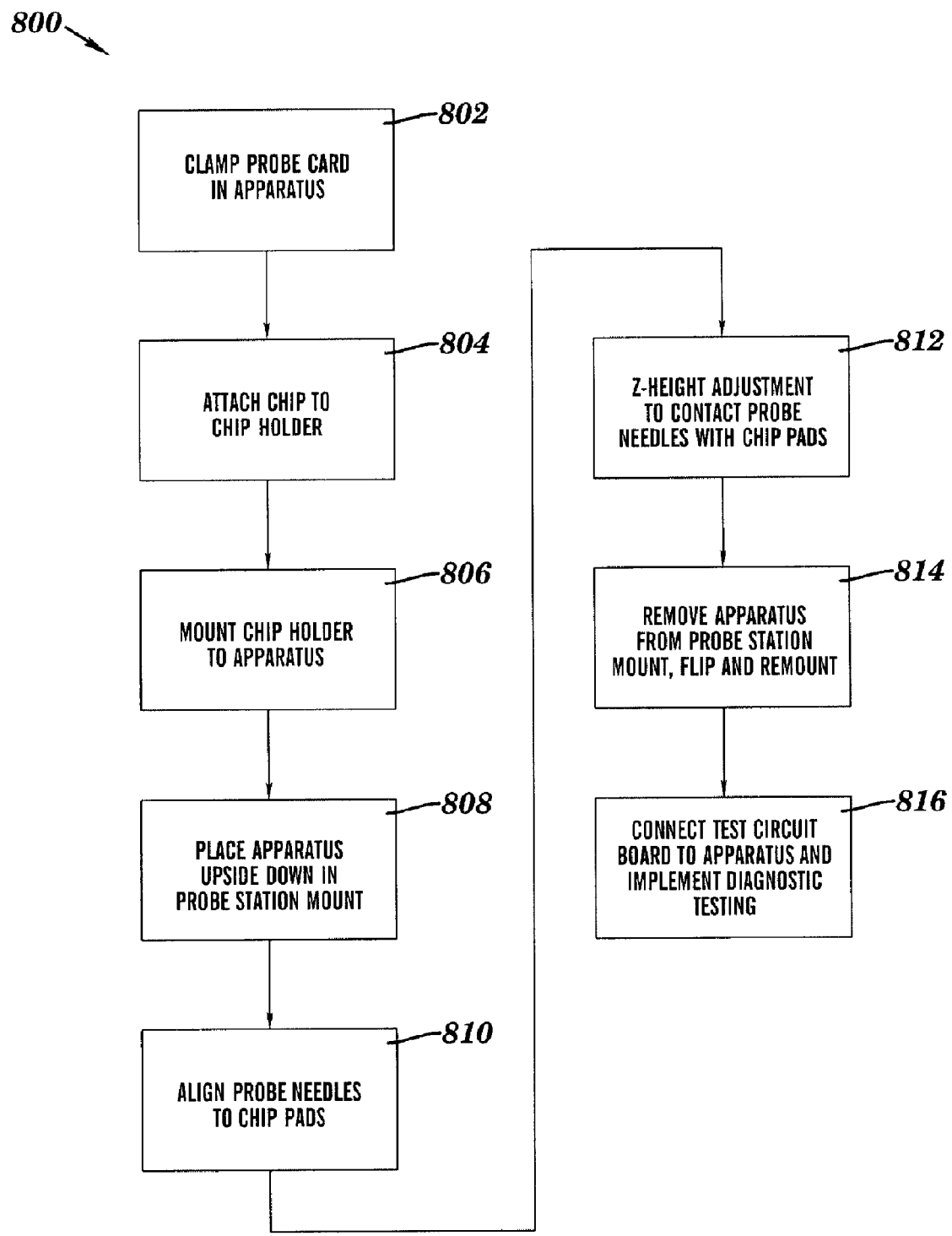
FIG. 8 is a detailed process flow diagram summarizing the single chip mounting, alignment, remounting and test steps in FIG. 7.

Finally, FIGS. 7 and 8 illustrate a process flow diagrams of a method 700 of implementing single die backside probing and analysis, using apparatus 200, in accordance with a further embodiment of the invention. In particular, the general process flow of FIG. 7 may be compared to the conventional process flow of FIG. 1. The initial steps of method 700 of testing and dicing of a wafer (blocks 702, 704) are similar to that of FIG. 1. However, rather than having to send out an individual die for packaging, method 700 allows for the mounting of a single die onto a chip holder apparatus at block 706, such as apparatus 200 described above. This sequence takes minutes instead of waiting several weeks for individual packaging to be completed.

Once the die is mounted, aligned with the probe needles of the probe card and remounted to the test station, the mounted die is retested as shown in block 708. The retesting may include an image-based analysis as shown in block 710. Then, the die may be removed from the chip holder portion of the apparatus through an appropriate solvent, as shown in block 712. As opposed to destroying a package to remove the single die, the chip holder apparatus is reusable, thus providing a cost savings. Thereafter, a physical failure analysis may be performed on the single die if appropriate, as shown in block 714.

FIG. 8 is a detailed process flow diagram 800 summarizing the single chip mounting, alignment, remounting and test steps discussed above in conjunction with apparatus 200. In block 802, a probe card (e.g., probe card 230) clamped to a chip mounting apparatus (e.g., apparatus 200). Then, a chip is attached to a chip holder (block 804), after which the chip holder is mounted to the rest of the apparatus, as shown in block 806. Prior to aligning the needles of the probe card to the corresponding probe pads on the chip, the apparatus is placed in an alignment orientation in a probing station, as shown in block 808.

In block 810, the probe needles are aligned to the chip pads (e.g., facilitated by the flexibility of the chip holder 202 with respect to the lift plate 204 of the apparatus 200). Then, as shown in block 812, the Z-height adjustment feature of the apparatus (e.g., engagement of lift ring 206) is engaged to bring the probe needles into contact with the probe pads on the chip. The apparatus may then be removed from the probe station, flipped, and remounted into an analysis configuration as shown in block 814, after which the test circuitry is finally connected for diagnostic testing as shown in block 816.

While the invention has been described with reference to a preferred embodiment or embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. An apparatus for facilitating single die backside probing of semiconductor devices, comprising:
   a chip holder configured for receiving a single integrated circuit die attached thereto;
   said chip holder maintained in flexible engagement in an X-Y orientation with respect to a lift plate; and
   a lift ring coupled to said lift plate, said lift ring configured to facilitate adjustment of said lift plate and said chip holder in a Z-direction.

2. The apparatus of claim 1, further comprising a main mounting surface, said main mounting surface configured to maintain said lift ring and said lift plate thereon, and said main mounting surface having a probe card secured thereon such that probe needles of said probe card are positioned for removable engagement with respect to corresponding surfaces on said die.

3. The apparatus of claim 2, wherein said chip holder is configured with an opening therein, said opening configured for facilitating an image-based analysis of said single integrated circuit die.

4. The apparatus of claim 1, further comprising one or more spring clips for maintaining said chip holder in flexible engagement in an X-Y orientation with respect to said lift plate.

5. The apparatus of claim 1, wherein said lift ring is coupled to said lift plate in threaded engagement.

6. A system for facilitating single die backside probing of semiconductor devices, comprising:
   a probing station; and
   a chip holder apparatus configured for mounting in said probing station, said chip holder apparatus further comprising a chip holder configured for receiving a single integrated circuit die attached thereto;
   said chip holder maintained in flexible engagement in an X-Y orientation with respect to a lift plate; and
   a lift ring coupled to said lift plate, said lift ring configured to facilitate adjustment of said lift plate and said chip holder in a Z-direction.

7. The system of claim 6, further comprising a main mounting surface, said main mounting surface configured to maintain said lift ring and said lift plate thereon, and said main mounting surface having a probe card secured thereon such that probe needles of said probe card are positioned for removable engagement with respect to corresponding surfaces on said die.

8. The system of claim 7, wherein said probing station further comprises:
   an alignment plate mounted on a chuck, said alignment plate having alignment pins configured to engage corresponding holes in said chip holder, as said chip holding apparatus is mounted in said probing station in a first orientation for aligning said probe needles of said probe card with said corresponding surfaces on said die.

9. The system of claim 8, wherein said probing station is further configured to receive said chip holding apparatus in a second orientation flipped with respect to said first orientation, wherein said second orientation facilitates connection of test circuitry to said probe card.

10. The system of claim 6, wherein said chip holder is configured with an opening therein, said opening configured for facilitating an image-based analysis of said single integrated circuit die.

11. The system of claim 6, further comprising one or more spring clips for maintaining said chip holder in flexible engagement in an X-Y orientation with respect to said lift plate.

12. The system of claim 6, wherein said lift ring is coupled to said lift plate in threaded engagement.

13. A method for implementing single die backside probing of semiconductor devices, the method comprising:
   attaching a single integrated circuit die to a chip holder portion of a chip holding apparatus;
   mounting said chip holding apparatus to a probing station in a first orientation;
   aligning probe needles of a probe card to corresponding surfaces on said die, said probe card maintained in flexible engagement with said chip holding apparatus;
   engaging a Z-axis height adjustment feature of said chip holding apparatus so as to bring said probe needles into contact with said corresponding surfaces on said die; and
   removing and remounting said chip holding apparatus to said probing station in a second orientation flipped with respect to said first orientation, wherein said second orientation facilitates connection of test circuitry to said probe card.

14. The method of claim 13, wherein said mounting said chip holding apparatus to a probing station in a first orientation further comprises:
   mounting an alignment plate on a chuck included within said probing station; and
   engaging alignment pins of said alignment plate with corresponding holes in said chip holder portion of said chip holding apparatus.

15. The method of claim 14, wherein said chip holder portion is configured with an opening therein, said opening configured for facilitating an image-based analysis of said single integrated circuit die.

16. The method of claim 13, further comprising:
prior to said aligning probe needles of said probe card to corresponding surfaces on said die, engaging said Z-axis height adjustment feature of said chip holding apparatus so as to provide a clearance between said probe needles and said die.

17. The method of claim 13, wherein said chip holding apparatus further comprises:
a lift plate, wherein said chip holder portion is maintained in flexible engagement in an X-Y orientation with respect to said lift plate; and
a lift ring coupled to said lift plate, said lift ring configured to facilitate adjustment of said lift plate and said chip holder portion in a Z-direction.

18. The method of claim 17, wherein said chip holding apparatus further comprises a main mounting surface, said main mounting surface configured to maintain said lift ring and said lift plate thereon, and said main mounting surface having said probe card secured thereon such said probe needles of said probe card are positioned for removable engagement with respect to said corresponding surfaces on said die.

19. The method of claim 17, further comprising one or more spring clips for maintaining said chip holder portion in said flexible engagement in said X-Y orientation with respect to said lift plate.

20. The method of claim 17, wherein said lift ring is coupled to said lift plate in threaded engagement.

\* \* \* \* \*